United States Patent [19]
Kaneko

[11] Patent Number: 5,690,233
[45] Date of Patent: Nov. 25, 1997

[54] CARRIER TAPE WITH RECESSES FOR ELECTRONIC PARTS

[75] Inventor: Satoshi Kaneko, Toyoake, Japan

[73] Assignee: Kaneko Denki Kabushiki Kaisha, Nagoya, Japan

[21] Appl. No.: 678,455

[22] Filed: Jul. 9, 1996

[51] Int. Cl.[6] ............................................. B65D 73/02
[52] U.S. Cl. ...................... 206/714; 206/713; 206/724
[58] Field of Search ............................. 206/390, 560, 206/713, 714, 716, 722, 724, 725

[56] References Cited

U.S. PATENT DOCUMENTS

| | | | |
|---|---|---|---|
| 3,417,865 | 12/1968 | Suverkropp et al. | 206/724 |
| 4,583,641 | 4/1986 | Gelzer | 206/714 |
| 4,760,917 | 8/1988 | Vitek | 206/724 |
| 5,085,321 | 2/1992 | Chew | 206/724 |
| 5,259,500 | 11/1993 | Alvite et al. | 206/714 |
| 5,472,085 | 12/1995 | Gelzer | 206/714 |

*Primary Examiner*—David T. Fidei
*Attorney, Agent, or Firm*—Dennison, Meserole, Pollack & Scheiner

[57] ABSTRACT

A carrier tape is provided with a large number of accommodating recesses with each recess having a bottom surface, the top surface being open to accept an electronic part. Each accommodating recess is provided with resilient retainer arms formed together as a unit extending from the top surface of the recess, the resilient retainer arms permitting the electronic part to be inserted into the recess but preventing it from falling off.

3 Claims, 11 Drawing Sheets

CARRIER TAPE WITH RECESSES FOR ELECTRONIC PARTS

BACKGROUND OF THE INVENTION

1. Field of the Invention

This invention relates to an improvement of a carrier tape provided in a line with a large number of accommodating recesses to contain electronic parts or the like.

2. Description of the Prior Art

Electronic parts in general are very fine parts, so that those are contained in a carrier tape provided in a line with accommodating recesses to contain a large number of the electronic parts or the like to transport such fine parts by accommodating them individually without damage or to be beneficial in utilization in the installing apparatus for assembly of the electronic parts or the like. Referring to FIG. 11, there is shown a conventional carrier tape 51 which is provided in a line with a large number of accommodating recesses 52, 52, 52 to respectively contain electronic parts 54, 54, 54 at a predetermined interval in a continuous condition. In the condition that the electronic parts 54 are contained in the respective accommodating recesses 52, the top surface of the carrier tape 51 is stuck with a removable sheet 53 to prevent the electronic parts 54 from falling off from the accommodating recesses 52. In such a carrier tape 51, which is loaded on the installing apparatus, the above-mentioned removable sheet 53 is removed in the prior process when the electronic parts 54 are respectively unloaded from the accommodating recesses 52. Consequently, in the conventional carrier tape 51, the process to stick the removable sheet 53 is necessary in the manufacturing, and a removing means for the removable tape 53 is required in the operation of the installing apparatus. As a result, there is a problem that the conventional carrier tape 51 is expensive in the cost of the manufacture and the operation.

Furthermore, there is another problem that when the removable sheet 53 is removed during the transportation of such a carrier tape 51 turned upside down in the installing apparatus, the electronic parts 54 had fallen off from the accommodating recesses 52, so that it is actually difficult to load the carrier tape 51 turned upside down on the installing apparatus.

SUMMARY OF THE INVENTION

The present invention is originated in order to resolve the above-mentioned conventional problems, and the object of the invention is to provide a carrier tape which is inexpensive in the manufacturing cost, capable of simplifying the installing apparatus in the operation, and can be fed in the condition turned upside down.

Consequently, the first aspect of the invention is that in a carrier tape made of an embossed resin-tape provided in a line with a large number of accommodating recesses with the bottom of which the top surface is open to accommodate electronic parts or the like, the improvement comprises a retainer arm formed together as a unit with said top surface of said respective accommodating recesses to prevent the contained electronic parts from falling off out of the recesses.

Also, the second aspect of the invention is that the above-mentioned retainer flap comprises a pair of resilient members oppositely projected to the inside of the accommodating recess.

As described above, in the first aspect on the top surface of the respective accommodating recesses of the carrier tape are formed the retainer arms, which can effectively prevent electronic parts from falling off from the accommodating recesses in which the parts are contained. Consequently, the conventional removable sheet on the top surface is not required so that it is possible to reduce the manufacturing cost. Also in the installing apparatus the removing means for the removable sheet becomes unnecessary so that it is possible to simplify the apparatus, and besides the removing process for the removable sheet also becomes unnecessary, so that it becomes possible to reduce the manufacturing cost. Furthermore, when the installing apparatus is operated with the carrier tape loaded, the retainer arm can favorably prevent the electronic parts from falling off downward, so that it becomes possible to feed the carrier tape set upside down in the installing apparatus and further to feed simultaneously a plurality of carrier tapes respectively set upward and downward.

Furthermore, in the second substance of the invention, when a large number of carrier tapes are piled up, the retainer arms are not in the way, so that it is possible to transport the tapes in a compact configuration. Also, since the retainer flap comprises a pair of resilient members in the opposite condition, it can surely prevent the electronic parts from falling off. Moreover, since the retainer arms are made of resilient material, when the electronic parts are loaded in the accommodating recesses,the retainer arms are not in the way and can favorably fit and press the electronic parts contained in the accommodating recesses. Also, when the electronic parts are unloaded from the accommodating recesses, the retainer arms are easily bent, so that the unloading can be easily performed. Besides, when the retainer arms are used in the condition in contact with the electronic parts, they have the effect to increase the retaining force in theaccommodating recesses.

DETAILED DESCRIPTION OF THE PREFERRED EMBODIMENT

An embodiment of the present invention will now be explained with reference to the accompanying drawings.

Figure 1:
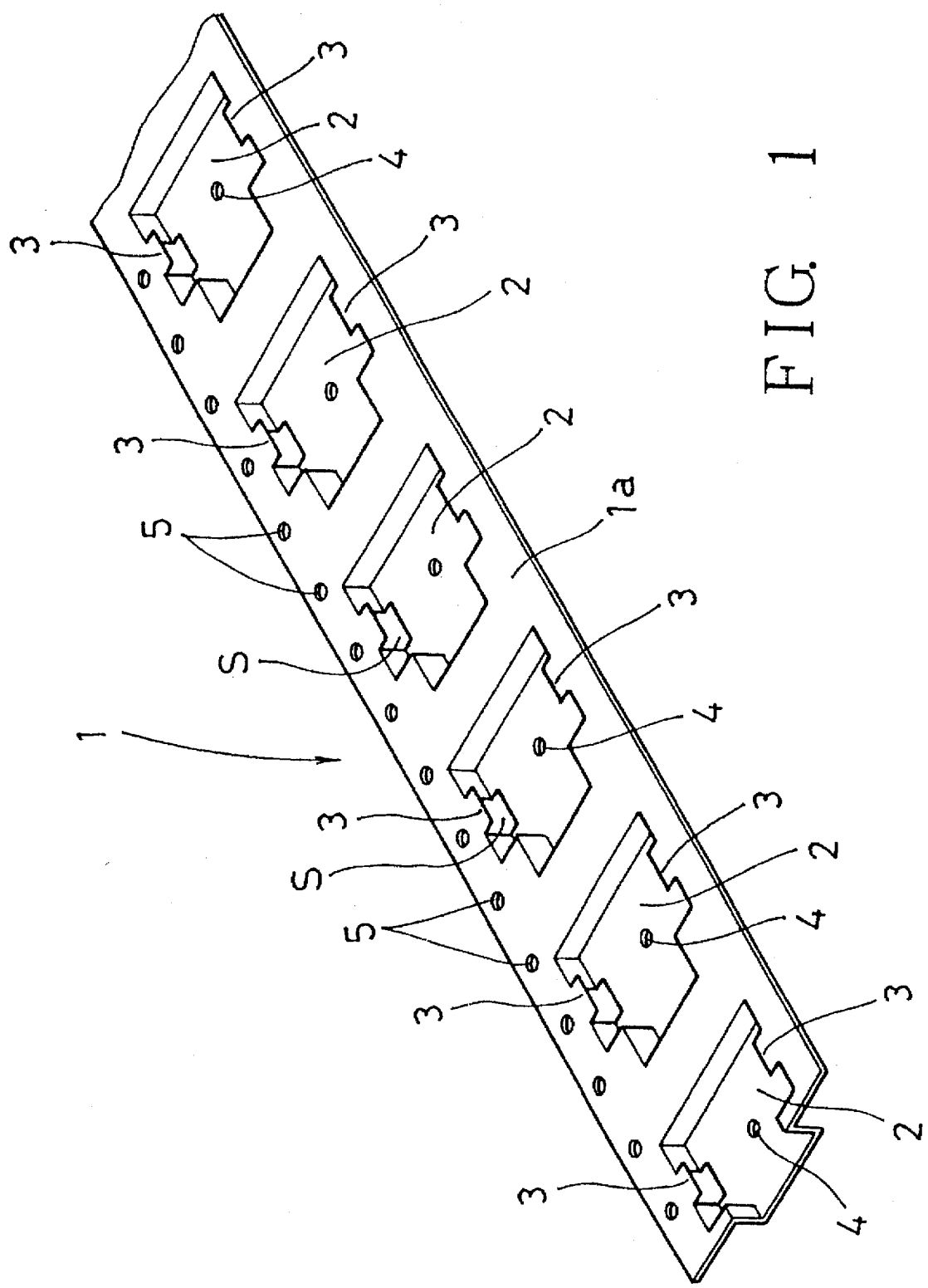
FIG. 1 is a perspective view of the first embodiment of the carrier tape.
Figure 2:
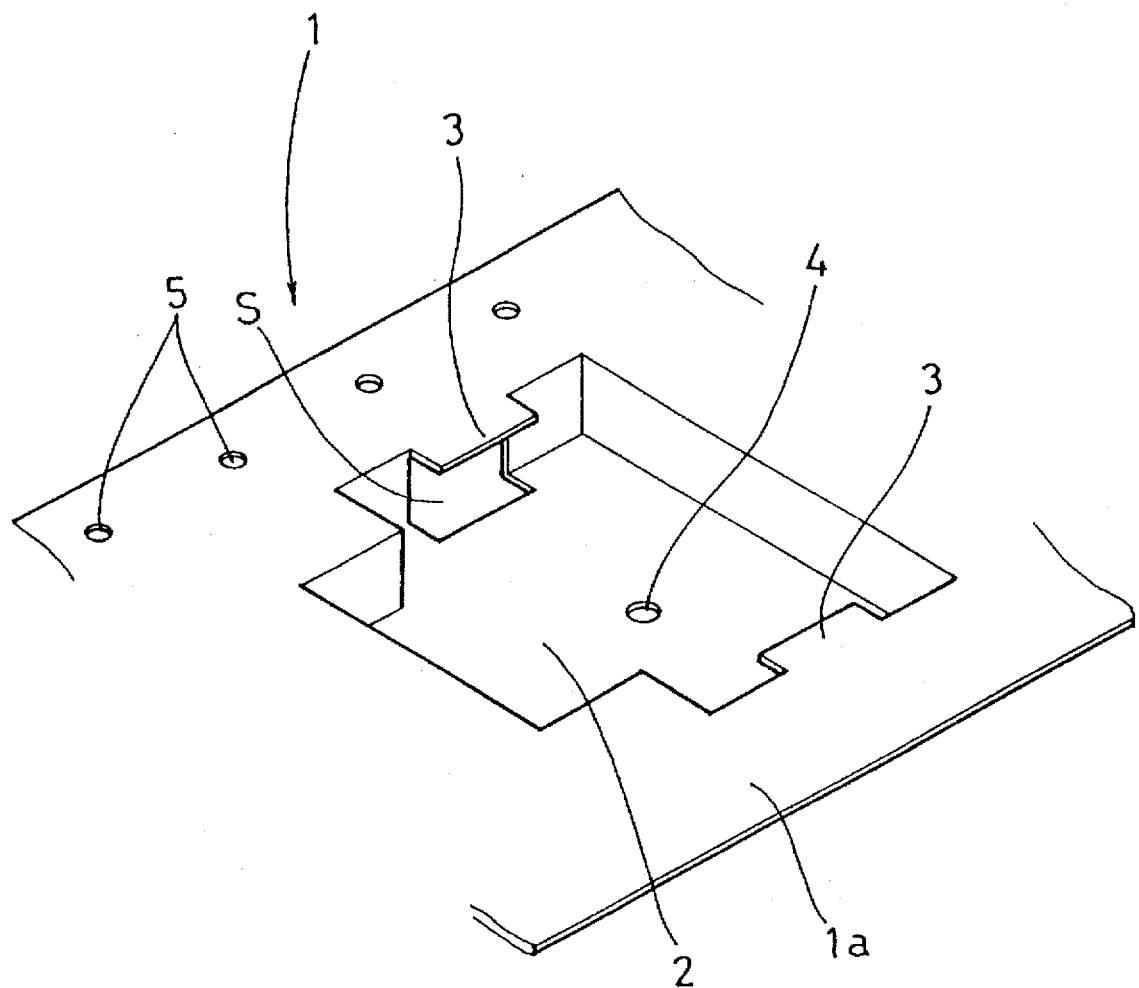
FIG. 2 is an enlarged view of the principal portion in FIG. 1.

FIG. 1 is a perspective view of the first embodiment of the carrier tape, and FIG. 2 is an enlarged view of the tape.

A carrier tape 1 is formed of embossed resin-tape, and a large number of accommodating recesses 2, 2, 2 are embossed longitudinally on the tape at a predetermined interval by a press or the like. Within the respective accommodating recesses 2, 2, 2 the electronic parts can be contained, and each accommodating recess is formed with an opening on the top surface 1a and a bottom on the lower surface. A pair of retainer arms 3, 3 are oppositely formed projecting horizontally to the inside of the accommodating recess 2 on the top surface 1a. These retainer arms 3, 3 are formed together as a unit with the top surface when each accommodating recess 2 is embossed. That is, by forming the cut-out portion S the retainer arms 3, 3 and the accommodating recess 2 are simultaneously formed in a single process by the press or the like.

The retainer arms 3, 3 are formed to be flush with the top surface 1a of the carrier tape 1 and project horizontally toward to the inside of the accommodating recess 2. The respective retainer arms 3, 3 are given resiliency, and each has a free end at the tip side. In nearly the center of the bottom of each accommodating recess 2 a push-out hole 4 is formed for inserting a pushing pin of the installing apparatus. Also, in the side or edge portion of the carrier tape 1 are longitudinally or formed or drilled feed holes 5, 5, 5 at a predetermined interval.

When the electronic parts 2, 2, 2 are loaded in the respective recesses of the carrier tape 1 as described above, the electronic part is pressed into the accommodating recess 2 from the top surface, the retainer arms 3, 3 are bent downward to make the part go through, and the part can be properly fitted and contained in the accommodating recess. After that, the retainer arms 3, 3 return to the surface of the contained electronic part preventing the part from falling off from the recess 2. Even when the carrier tape 1 is positioned upside down with having the electronic parts contained in the accommodating recesses 2, it is possible to prevent the electronic parts from falling off downward from the accommodating recesses owing to the retainer arms 3, 3.

Consequently, when the carrier tape 1 is loaded on the installing apparatus in the factory or the like, the sprockets or the like fit in the feed holes 5, 5, 5, and the carrier tape 1 is fed by turns in a longitudinal direction through the rotation of the sprocket wheel in the installing apparatus. Then, the electronic parts contained in the respective accommodating recesses 2 are respectively taken out in sequence through the unloading means. In this case, also owing to the resiliency of the retainer arms 3, 3, the electronic parts can be easily pulled and taken out from the accommodating apparatus 2 through the unloading means. Also, in such a carrier tape 1, the feeding is possible in the condition of the top surface 1a either directing upward as shown in FIG. 1 or directing downward, and thereby the simultaneous feeding of a plurality of the carrier tapes 1 can be performed in the installing apparatus. Consequently, it becomes possible to improve the efficiency of the installing apparatus compared to the conventional situation.

Incidentally, the length of the retainer arms 3, 3 projected toward the inside of the accommodating recess 2 can be properly adjusted, and the shape of the retainer arms 3, 3 can be suitably changed. In this embodiment, although the retainer arms 3, 3 are illustrated as a pair of arms formed across the width of the carrier tape, they may be formed along the longitudinal direction of the tape. Besides, the retainer arms are not limited to two arms 3, 3, but they may be respectively formed either in the transverse or in the longitudinal direction of the carrier tape 1.

Figure 3:
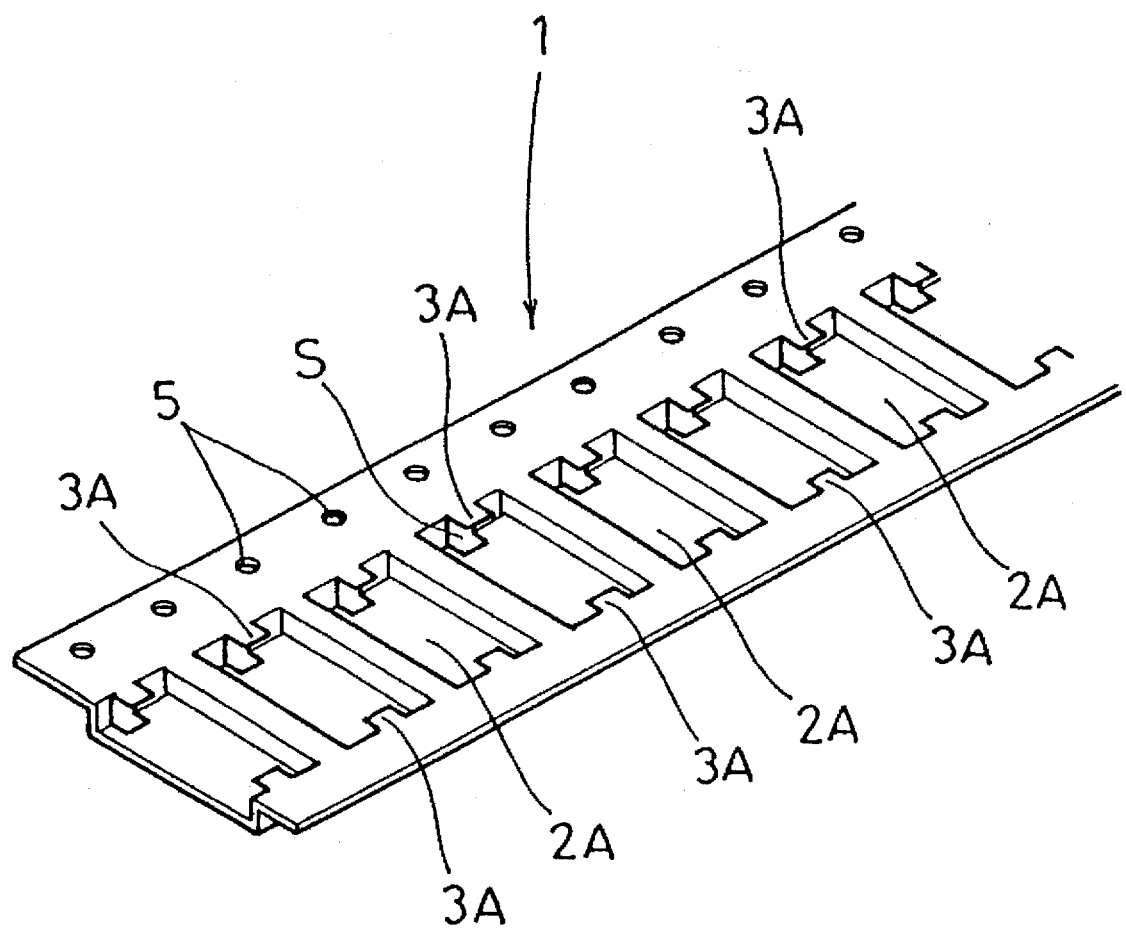
FIG. 3 is a perspective view of the second embodiment of the carrier tape.

Next, referring to FIG. 3, the carrier tape 1 is illustrated as one having an accommodating recess 2A which has a shape different from the first embodiment. The shape of this accommodating recess 2A is suitably determined corresponding to the electronic parts to be contained. Each of the accommodating recesses 2A, 2A, 2A is provided on the top surface with a pair of retainer arms 3A, 3A projected inward, by which arms 3A, 3A the electronic parts contained in the accommodating recess 2A can be effectively prevented from falling off from the recess.

Figure 4:
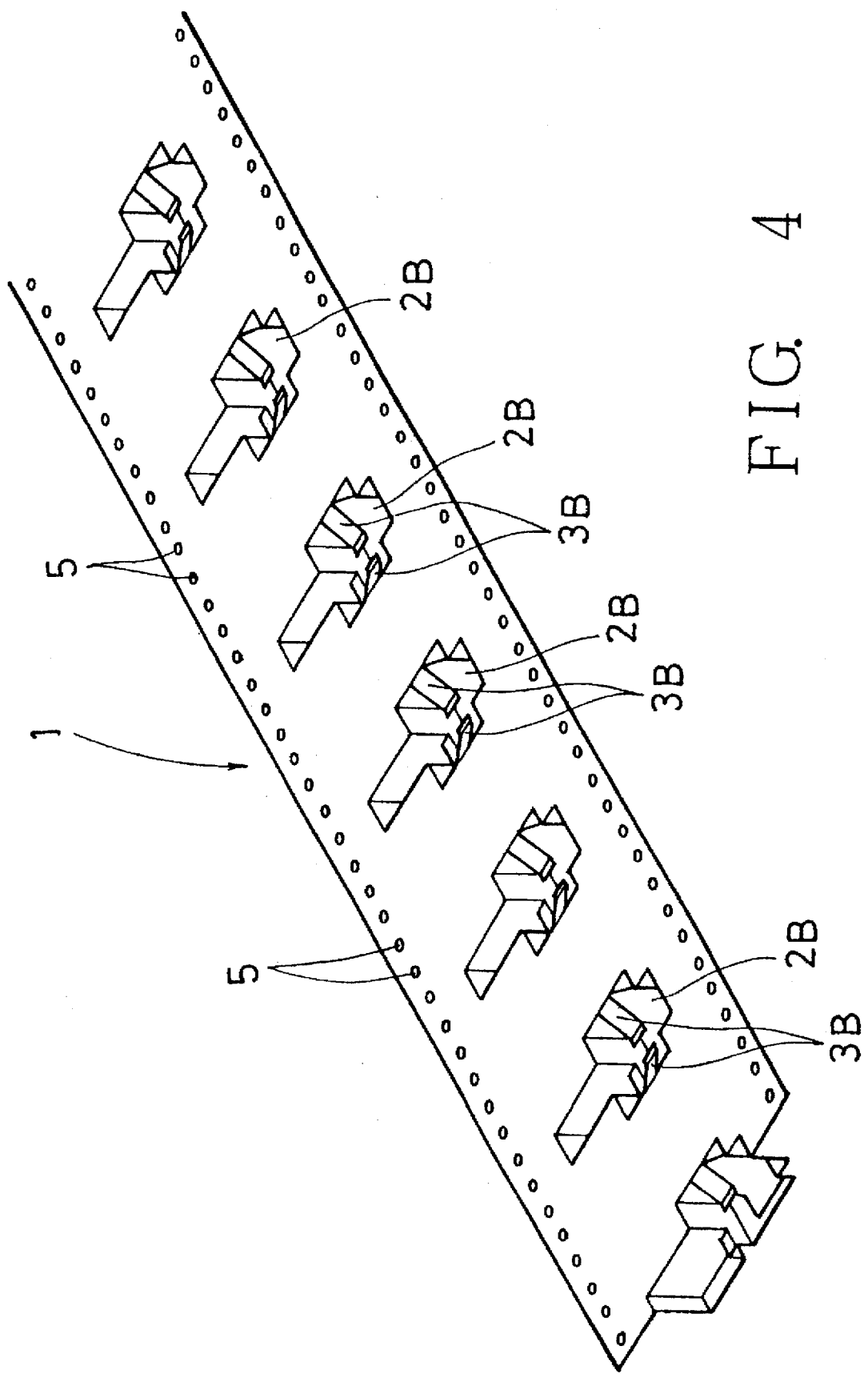
FIG. 4 is a perspective view of the third embodiment of the carrier tape.
Figure 5:
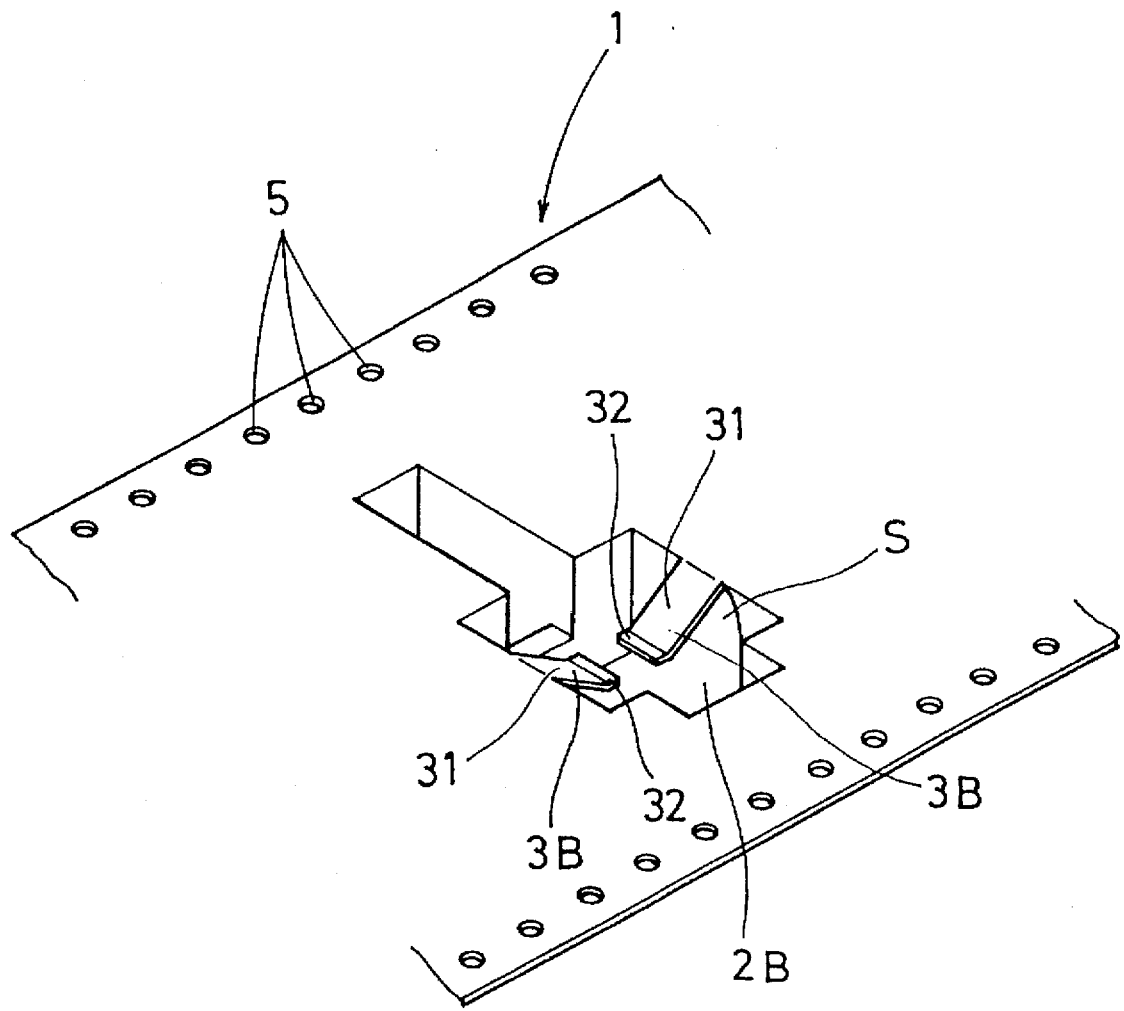
FIG. 5 is an enlarged view of the principal portion in FIG. 4.
Figure 6:
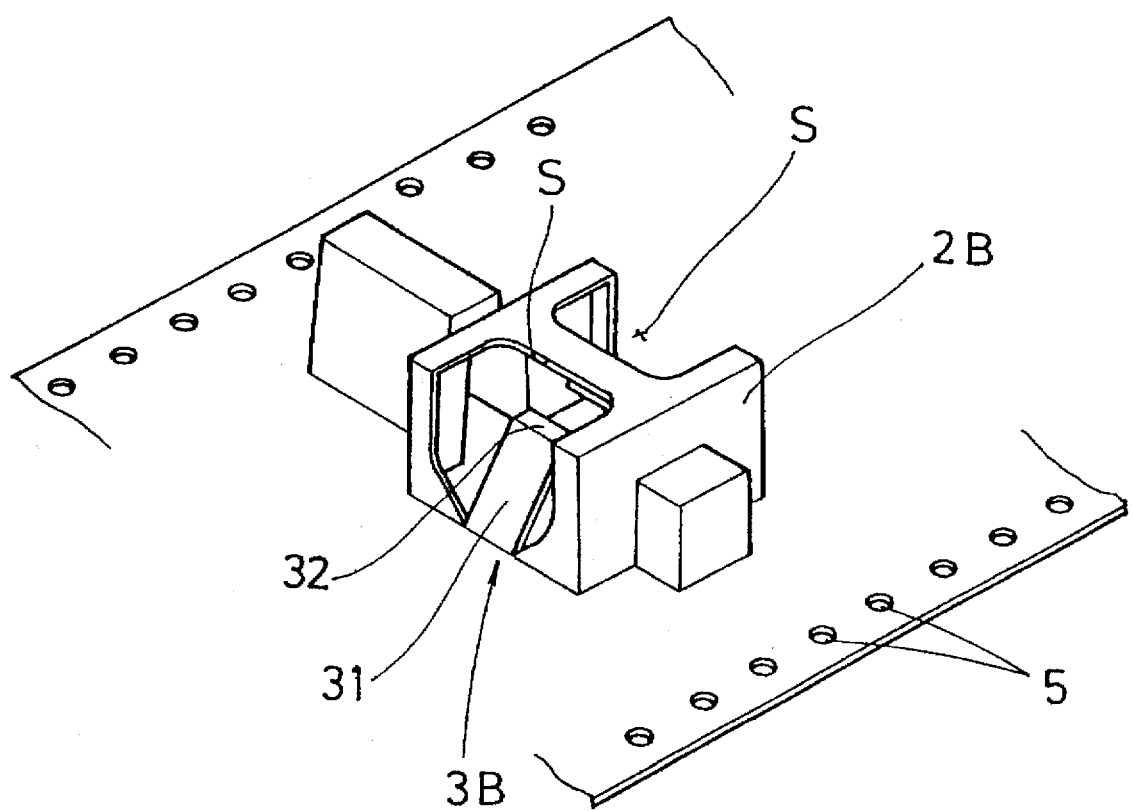
FIG. 6 is a perspective rear view of the principal portion in FIG. 5.
Figure 7:
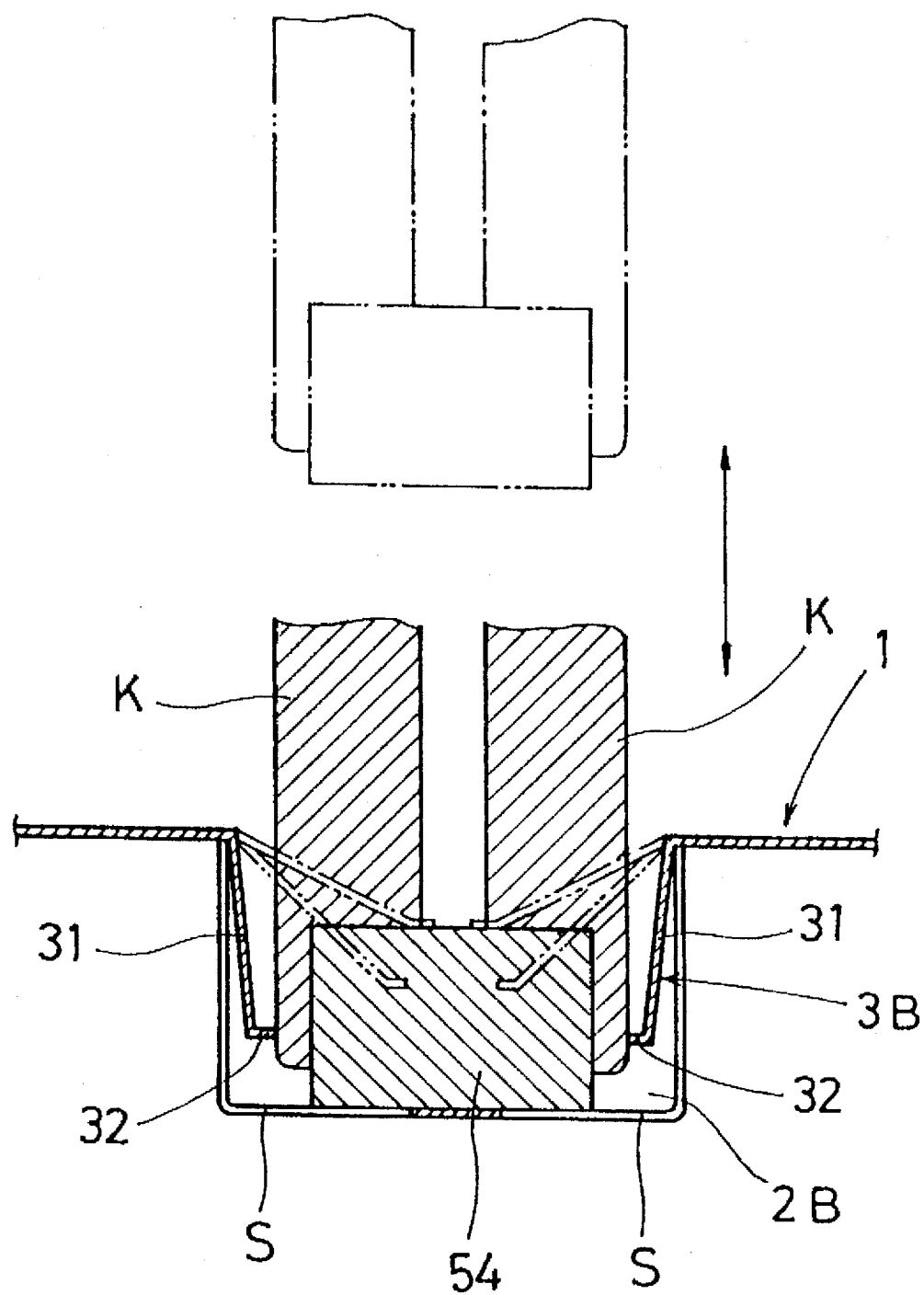
FIG. 7 is a sectional view illustrating the loading of the electronic parts or the like by clamping claws into the accommodating recess.

Next, in the carrier tape 1 shown in FIG. 4, the accommodating recess 2B has its shape shape changed and the retainer arm 3B also has the shape changed. FIG. 5 shows an enlarged view of the accommodating recess 2B, and FIG. 6 shows a perspective rear view of the recess.

A pair of the retainer arms 3B, 3B oppositely formed and projected to the inside of the accommodating recess 2B comprise respectively a slant portion 31 inclined downward to the inside of the recess 2B from the top surface of the carrier tape 1 and a horizontal portion 32 horizontally bent at the lower end of the slant portion 31. Besides, the bottom of the accommodating recess 2B is largely cut through and provided with a cut-out portion S.

In such a pair of the retainer arms 3B, 3B formed as described above, when an electronic part 54 or the like, which is in the condition put between a pair of clamping claws K, K, is inserted into the accommodating recess 2B from the top surface, a pair of the retainer arms 3B, 3B are moved downward owing to their resiliency. Then, after the clamping claws K, K are opened and pulled upward, a pair of the retainer arms 3B, 3B are returned upward by their resiliency and put in contact to the sides of the electronic part 54, and can hold the electronic part 54 in a pinched condition in the accommodating recess 2B. Also, in a different kind of electronic parts 54, a pair of the retainer arms 3B, 3B, as shown in the imaginary lines, press the top surface of the electronic part 54 through their resiliency and can firmly retain the part 54 in the accommodating recess 2B. Thus, a pair of the retainer arms 3B, 3B can increase the retaining force in the condition in contact with the electronic part 54.

Also, in the case of taking out the electronic part 54 which has been contained as described above, the clamping claws K, K are inserted from the top surface of the carrier tape 1 to grasp the electronic part 54 and pull it upward, so that the electronic part 54 can be easily unloaded from the accommodating recess 2B. Consequently, the carrier tape 1 is in a good operating condition in the installing apparatus, and it becomes easy to enable the automation of the installing apparatus.

Some of the electronic parts to be contained in the accommodating recesses 2B can be soaked in organic solvent or water together with the carrier tape 1 as they are contained in the recesses 2B and can be washed as they are loaded in the carrier tape 1. During this washing, the washing liquid or the like can favorably circulate through the above-described cut-out portion S, so that it becomes possible to improve the washing effect.

Figure 8:
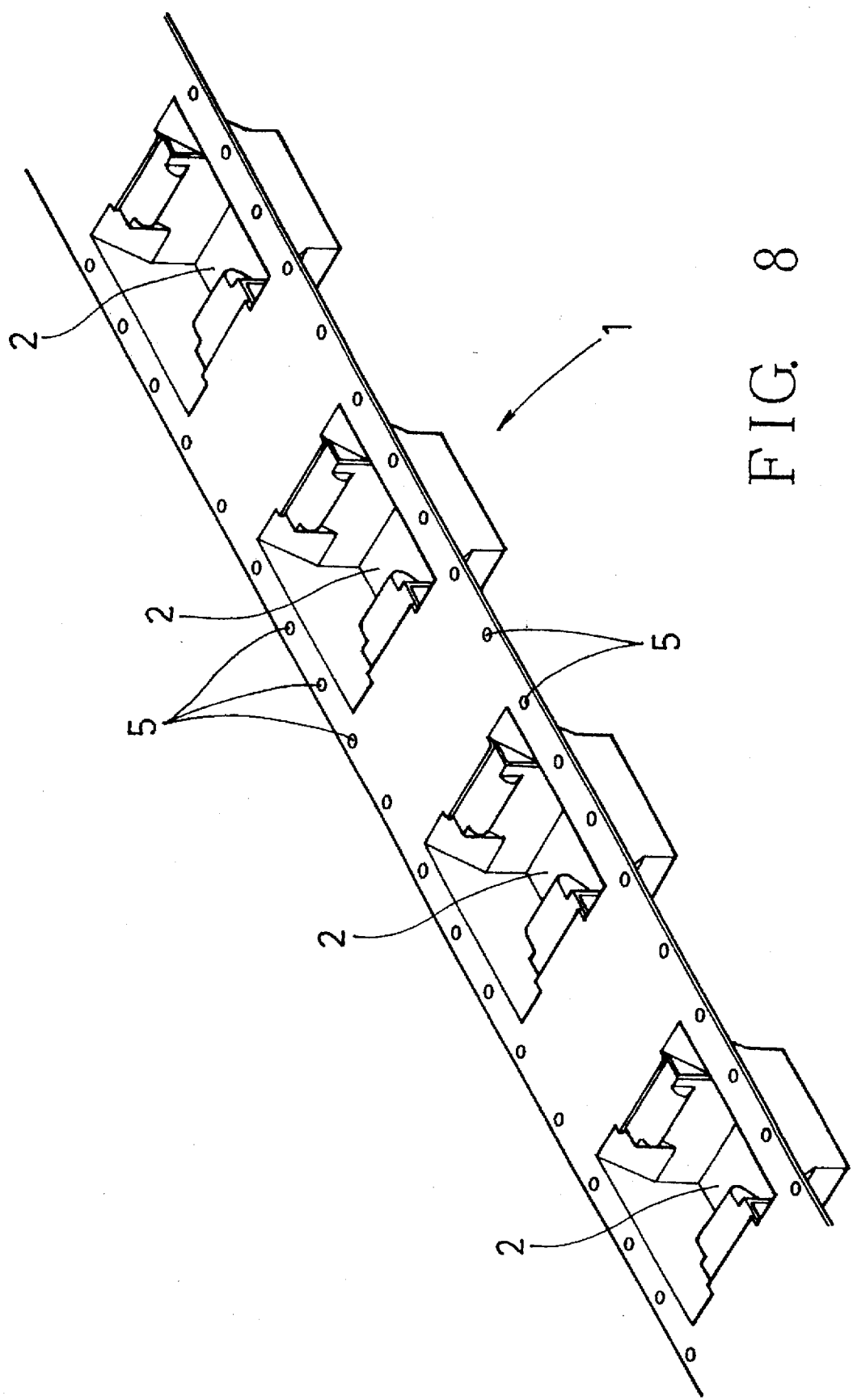
FIG. 8 is a perspective view of the fourth embodiment of the carrier tape.
Figure 9:
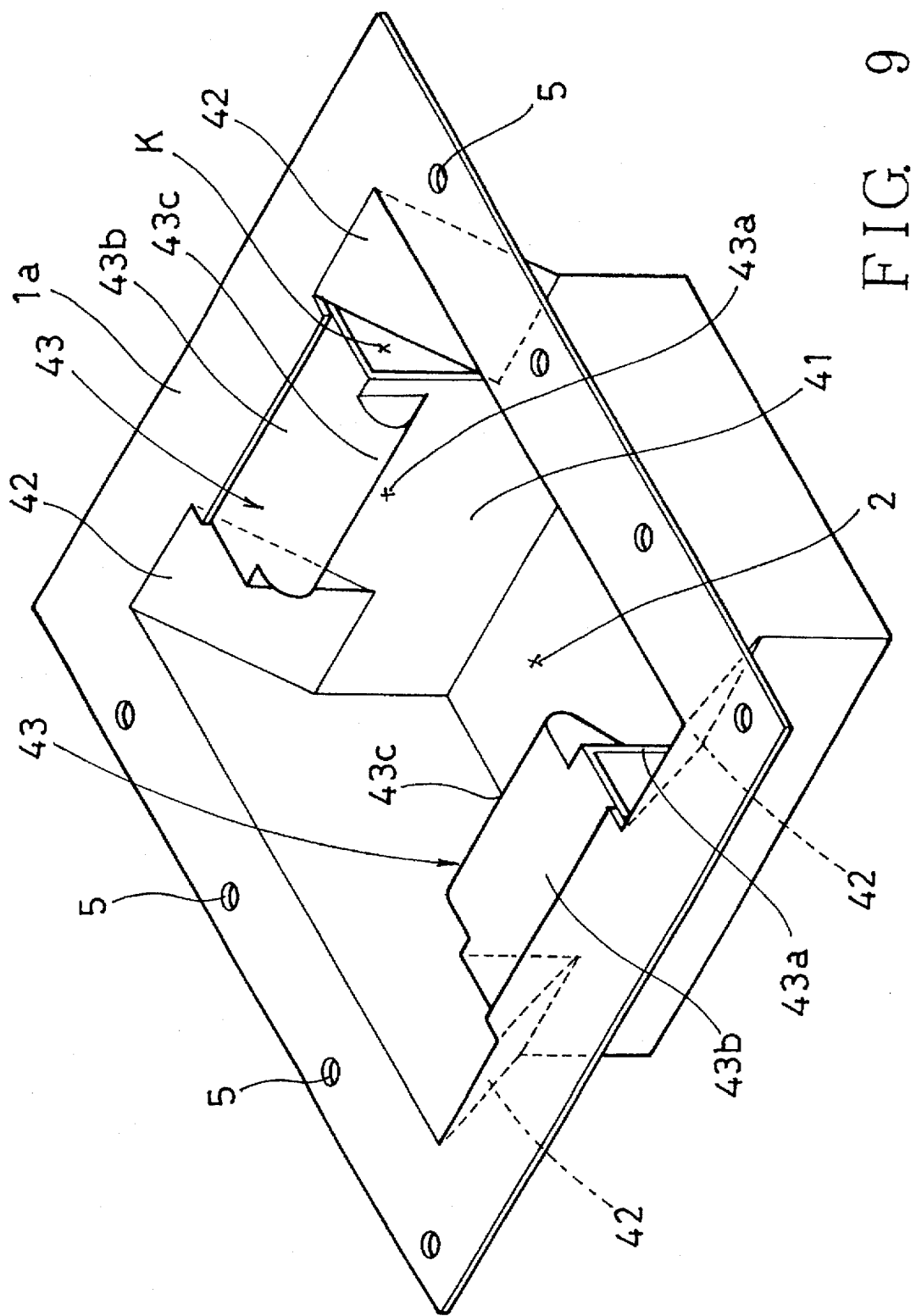
FIG. 9 is an enlarged view of the principal portion in FIG. 8.
Figure 10:
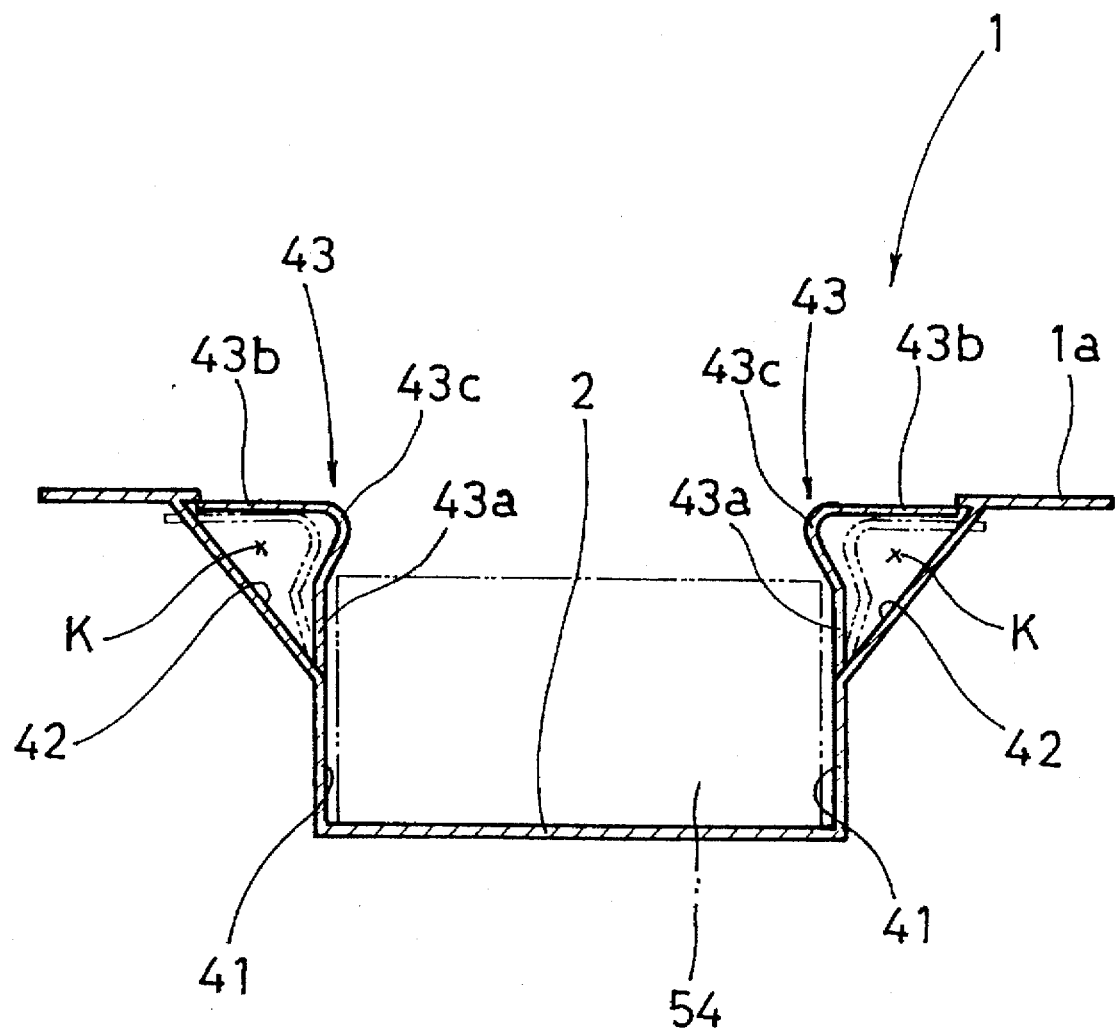
FIG. 10 is a sectional view of the principal portion in FIG. 9.
Figure 11:
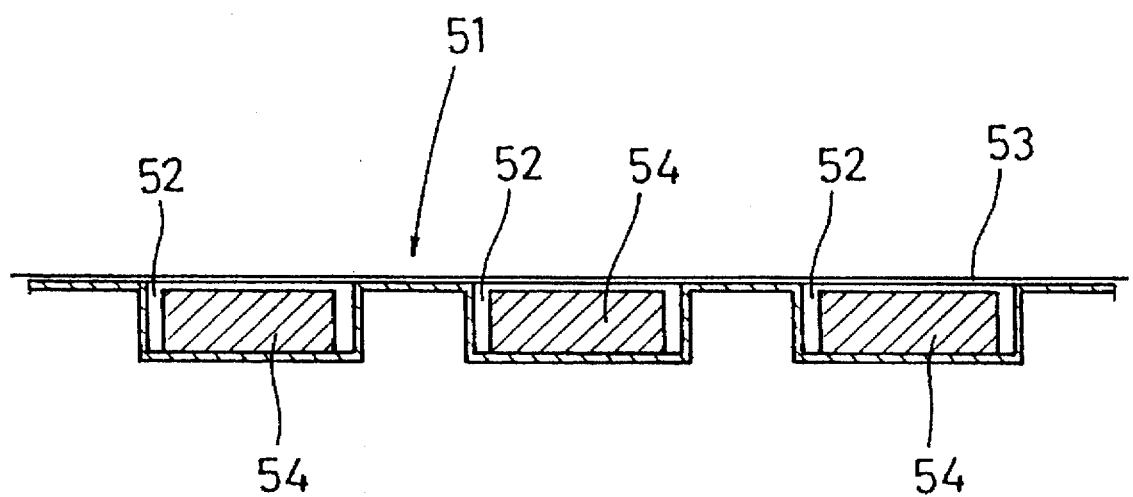
FIG. 11 is a sectional side view of the conventional carrier tape.

Next, in the carrier tape 1 shown in FIG. 8, the retainer arm has the shape further changed. FIG. 9 shows an enlarged view of the accommodating recess, and FIG. 10 shows a sectional view of the recess.

In this embodiment, the side wall of the accommodating recess 2 is designated as a vertical surface 41, and on the upper side of the surface 41 is formed a retainer arm 43. In each outer side of the retainer arm 43 is formed a slant surface 42 inclined to the top surface 1a. The retainer arm 43 is cut off and raised up from the opening K and formed as a unit with the slant surfaces 42, 42. The retainer arm 43 comprises a vertical resilient portion 43a continuously raised up from the above-described vertical surface 41, a horizontal portion 43b horizontally arranged on the level slightly lower than the top surface 1a of the carrier tape 1, and a swelling porton 43c projected inside of the accommodating recess 2 between both the ends of the horizontal portion 43b and the vertical resilient portion 43a. As shown in FIG. 10, when the electronic part 54 is inserted from the upper side into the inside of the accommodating recess 2, the part 54 comes in contact with the above-mentioned swelling portion 43c, expanding the retainer arms 43, 43 outward. In the condition that the electronic part 54 is contained in the accommodating recess 2, the swelling portion 43c returns over the top surface of this electronic part 54, so that the electronic part 54 is prevented from falling off.

As described above, in the carrier tape of the present invention, it is not required to stick the conventional removable sheet on the top surface of the tape, so that the carrier tape can be inexpensively formed without the cost to stick the removable sheet. Furthermore, also in the installing apparatus, the removing means for the removable sheet is unnecessary and the removing process is also unnecessary, so that it becomes possible to reduce the cost for operating the installing apparatus.

What is claimed is:

1. A carrier tape comprising:

a resin tape having a plurality of part accommodating recesses arranged in series along the tape by means of a press, each recess having a bottom surface and open top, and a pair of opposing retainer arms projecting toward an inside of the recess, the retainer arms being formed integral with the resin tape and being flush with a top surface of the resin tape, said pair of opposing retainer arms being bent downward to permit an electronic part to be inserted into the recess, and said retainer arms recovering their flush with the surface position and extending over a portion of the electronic part to prevent the inserted part from falling off the tape.

2. A carrier tape comprising:

a resin tape having a plurality of part accommodating recesses embossed by a press and arranged in series along the tape;

each recess having a bottom surface and open top for admitting an electronic part, and a pair of opposing retainer arms projecting toward the inside of the recess, the retainer arms being formed integral with the resin tape and extending in a longitudinal direction of the resin tape, each of said retainer arms having a slant portion and a horizontal portion, said slant portion being inclined downwardly from a top surface of the resin tape toward an inside of said accommodating recess, and said horizontal portion being horizontally bent at a lower end of said slant portion;

said pair of retainer arms having resiliency, so that said retainer arms are bent downwardly when a pair of clamping claws with the electronic part clamped therebetween are inserted into the accommodating recess, and said retainer arms contact both sides of the electronic part within said accommodating recess so as to hold the electronic part when said clamping claws are pulled upward from said accommodating recess.

3. A carrier tape comprising:

a resin tape having a plurality of accommodating recesses formed by embossing the sheet-like resin tape by means of a press and arranged in series along the resin tape, each accommodating recess having a bottom surface and open top for admitting an electronic part;

each accommodating recess having a pair of side walls having a slant surface, a vertical resilient portion, a swelling portion and a horizontal portion formed integrally with each other and formed simultaneously with forming said accommodating recess;

said slant surface being positioned on the upper side of said side wall;

said vertical resilient portion being formed by providing a slit in said side wall and by shaping a corresponding portion to be raised upwardly from said slant surface;

said swelling portions extending from an upper end of said vertical resilient portion and projecting inside of said accommodating recess;

said horizontal portion extending outward horizontally from an upper end of said swelling portion and being arranged on a level lower than a top surface of the resin tape;

said vertical resilient portion having resiliency, so that said swelling portion is moved outwardly through contact of the electronic part when the electronic part is inserted from the upper side into the accommodating recess, and said swelling portion returning over the top surface of the electronic part to prevent the electronic part from falling off from said accommodating recess when the electronic part has been contained in the accommodating recess.

* * * * *